(12) United States Patent
Gunapala et al.

(10) Patent No.: US 6,674,091 B2
(45) Date of Patent: Jan. 6, 2004

(54) MULTI-QUANTUM-WELL DETECTOR FOR LOW-BACKGROUND APPLICATIONS

(75) Inventors: Sarath D. Gunapala, Stevenson Ranch, CA (US); Sumith V. Bandara, Stevenson Ranch, CA (US); John K. Liu, Pasadena, CA (US); Sir B. Rafol, South Pasadena, CA (US); David Z. Ting, Arcadia, CA (US); Jason M. Mumolo, Altadena, CA (US)

(73) Assignee: California Institute of Technology, Pasadena, CA (US)

( * ) Notice: Subject to any disclaimer, the term of this patent is extended or adjusted under 35 U.S.C. 154(b) by 11 days.

(21) Appl. No.: 09/967,842

(22) Filed: Sep. 26, 2001

(65) Prior Publication Data

US 2002/0074542 A1 Jun. 20, 2002

Related U.S. Application Data

(60) Provisional application No. 60/235,536, filed on Sep. 26, 2000.

(51) Int. Cl.$^7$ .................. H01L 27/146; H01L 31/0304
(52) U.S. Cl. ........................... 257/21; 257/184
(58) Field of Search .................. 257/21, 184

(56) References Cited

U.S. PATENT DOCUMENTS 5,023,685 A * 6/1991 Bethea et al. ............... 257/21
5,563,423 A * 10/1996 Wu et al. ..................... 257/21

OTHER PUBLICATIONS

Björn F. Andresen & Marija Strojnik, *Infrared Technology and Applications XXIII*, Proceedings of SPIE—The International Society for Optical Engineering, Apr. 20–25 1997, Orlando, Florida. vol. 3061, pp. 722–727, 740–748.

Sarath D. Gunapala et al.,*9 μm Cutoff 256x256 GaAs / $Al_xGa1-_xAs$ Quantum Well Infrared Photodector Hand–Held Camera*, IEEE Transactions on Electron Devices, Jan. 1997, vol. 44, No. 1, pp. 51–57.

W.A. Beck et al, Martin Marietta Laboratories., J. Albritton and M. Sensiper, Martin Marietta Electronics & Missles, Imaging Performance of 256x256 LWIR Miniband Transport Multiple Quantum Well Focal Plane Arrays.pps. 1–16.

B.F. Levine et al., *High Sensitivity low dark current 10 μm GaAs quantum well infrared photodetectors*, Applied Physics Letters, Feb. 26, 1990, vol. 56, No. 9, pp. 851–853.

G. Hasnain et al., *Large photoconductive gain in quantum well infrared photodetectors*, Applied Physics Letters, Aug. 6, 1990, vol. 57, No. 6, pp. 608–610.

B.F. Levine et al., *Photoexcited escape probability, optical gain, and noise in quantum well infrared photodetectors*. Journal of Applied Physics, Nov. 1, 1992, vol. 72, No. 9, pps. 4429–4443.

S.D. Gunapala et al., *Dependence of the performance of GaAs/ AlGaAs quantum well infrared photodetectors on doping and bias*.Journal of Applied Physics, May 1, 1991, vol. 69, No. 9. pp. 6517–6520.

S.D. Gunapala & K. M. S. V. Bandara, *Recent Developments in Quantum–Well Infrared Photodetectors*.Thin Films–Homojunction and Quantum–Well Infrared Detectors, vol. 21, pp. 114–232.

D. Reynolds, D. Seib, S. Stetson, T. Herter, N. Rowlands, and J. Schoenwald; Blocked impurity band hybrid infrared focal plane arrays for astronomy; IEEE Transactions on Nuclear Science, vol. 36, No. 1, Feb. 1989.

* cited by examiner

*Primary Examiner*—Jerome Jackson
(74) *Attorney, Agent, or Firm*—Fish & Richardson P.C.

(57) ABSTRACT

Device designs and techniques for reducing the dark current in quantum-well detectors.

11 Claims, 5 Drawing Sheets

MULTI-QUANTUM-WELL DETECTOR FOR LOW-BACKGROUND APPLICATIONS

LOW-BACKGROUND APPLICATIONS

This application claims the benefit of U.S. Provisional Application No. 60/235,536 filed Sep. 26, 2000.

ORIGIN

The devices and techniques described herein were made in the performance of work under a NASA contract, and are subject to the provisions of Public Law 96-517 (35 U.S.C. §202) in which the Contractor has elected to retain title.

BACKGROUND

This application relates to semiconductor radiation detectors, and in particular, to multi-quantum-well radiation detectors.

Semiconductor radiation detectors use optical absorption at optical transitions between two different energy levels to detect radiation by measuring the responses of the detectors caused by the optical absorption. The natural energy levels in extrinsically-doped semiconductors, such as doped silicon, may be used for detecting radiation. Properties of dopants and the host semiconductors may be selected to achieve desired detector performance, such as the detection spectral range, the spectral bandwidth, the responsivity, and the response time. However, the freedom in tailoring the detector performance is limited to the given natural properties of the dopants and the host semiconductors.

In another implementation, artificial multi-quantum-well structures are used to construct detectors. The structures and properties of the multiple quantum wells can be selected to achieve desired detector performance with greater flexibility and freedom than the extrinsically-doped semiconductor detectors. For example, an infrared quantum-well semiconductor detector usually includes a quantum-well structure formed of alternating active quantum well layers and barrier semiconductor layers. Such a quantum-well structure can have different energy bands each with multiple quantum states. An intraband transition between a ground state and an excited state in the same band (i.e., a conduction band or a valance band) can be used to detect infrared ("IR") radiation by absorbing IR radiation at or near a selected resonance IR wavelength. The absorption of the radiation generates electric charge indicative of the amount of received radiation. The radiation-induced charge can then be converted into an electrical signal (e.g., a voltage or current) to be processed by signal processing circuitry.

The compositions of lattice-matched semiconductor materials of the quantum well layers can be adjusted to cover a wide range of wavelengths for infrared detection and sensing. Quantum-well structures can achieve, among other advantages, high uniformity, a low noise-equivalent temperature difference, large format arrays, high radiation hardness, and low cost. Infrared quantum-well sensing arrays may be used for various applications, including night vision, navigation, flight control, and environmental monitoring.

SUMMARY

This application includes a multi-quantum-well (MQW) detector structure in a blocked intersubband detector (BID) configuration. The MQW structure is designed to operate on an intersubband transition for IR direction. Different from many MQW detectors where the MQW structure is sandwiched between an emitter contact and a collector contact layers, the BID device includes a thick blocking barrier layer between the MQW structure and the collector contact layer to block the dark current. In one embodiment, the thick blocking barrier layer is formed of an impurity-free semiconductor material.

When operating at low temperatures, e.g., about 20 to 30 K, the thermionic emission and thermally-assisted tunneling through the barrier layers in the MQW structure are suppressed. Hence, the carriers in the quantum wells are depleted by optical absorption. This carrier depletion causes the device to be less responsive and even becomes inoperative. To replenish the carriers to the MQW structure, the MQW structure is designed to have thin barrier layers to form a supperlattice MQW structure that support a ground state and an excited state minibands due to overlap of wavefunctions of adjacent quantum wells. This allows for sequential resonant tunneling of the electrons from the emitter contact layer. This tunneling refills the quantum wells and sustains the optical absorption of the MQW structure. The MQW structure is designed to have intersubband transition from a bound state to a quasibound state within either a conduction band and valance band.

In one embodiment, the BID device includes an emitter contact layer, a multi-quantum-well structure, a blocking barrier layer, and a collector contact layer in contact with the blocking barrier layer. The multi-quantum-well structure has a first side in contact with the emitter contact layer and an opposing second side that is in contact with the blocking barrier layer. The multi-quantum-well structure is formed of alternating quantum well layers and barrier layers, where each barrier layer is of a thickness that allows for a spatial overlap of wavefunctions of adjacent quantum wells to permit a tunneling therethrough from one quantum well to an adjacent quantum well. In particular, a tunneling structure is implemented in the MQW structure to allow for sufficient electronic tunneling through the barriers of the MQW structure to replenish the absorption-depleted quantum wells. This carrier replenishment mechanism built into the MQW structure ensures that, the MQW structure, whose dark current is suppressed by the blocking barrier layer and the cryogenic condition, maintains sufficient carrier population (no space charge layers or no dielectric relaxation) in the quantum wells to be optically responsive to incident radiation. The blocking barrier layer has a thickness that substantially prohibits a tunneling therethrough.

A method according to one embodiment includes providing a multi-quantum-well structure to allow for carrier tunneling through a barrier layer from one quantum well to an adjacent quantum well to provide carriers for optical absorption, and preventing any carrier tunneling from the multi-quantum-well structure to a contact layer that receives carriers from the multi-quantum-well structure to reduce a dark current.

DETAILED DESCRIPTION

The multi-quantum-well (MQW) detector structure in the blocked intersubband detector (BID) configuration is designed in part to reduce the background noise of the detector and hence to achieve a high detection sensitivity. The low background and low temperature operation is desirable in applications where the signal levels are weak and many conventional detectors are inadequate due to their background noise. Two mechanisms are used to reduce the background noise in the BID device: a blocking barrier layer formed between the MQW structure and the collector contact layer for blocking the dark current generated by the MQW structure and operating under a cryogenic temperature (e.g., about 20 to 30 K) to suppress thermal-induced dark current in the MQW structure.

The choice of the MQW structure is in part to provide flexibility and freedom in engineering the operating parameters to meet specific requirements of various applications. In particular, a supperlattice structure is implemented in the MQW structure to allow for sufficient electronic tunneling through the barriers of the MQW structure to replenish the absorption-depleted quantum wells. This carrier replenishment mechanism built into the MQW structure ensures that, the MQW structure, whose dark current is suppressed by the blocking barrier layer and the cryogenic condition, maintains sufficient carrier population (no space charge layers or no dielectric relaxation) in the quantum wells to be optically responsive to incident radiation. The combination of the above and other features allows the BID device to exhibit high responsivity and low background noise at relatively high cryogenic temperatures (e.g., above about 20 K).

Figure 1:
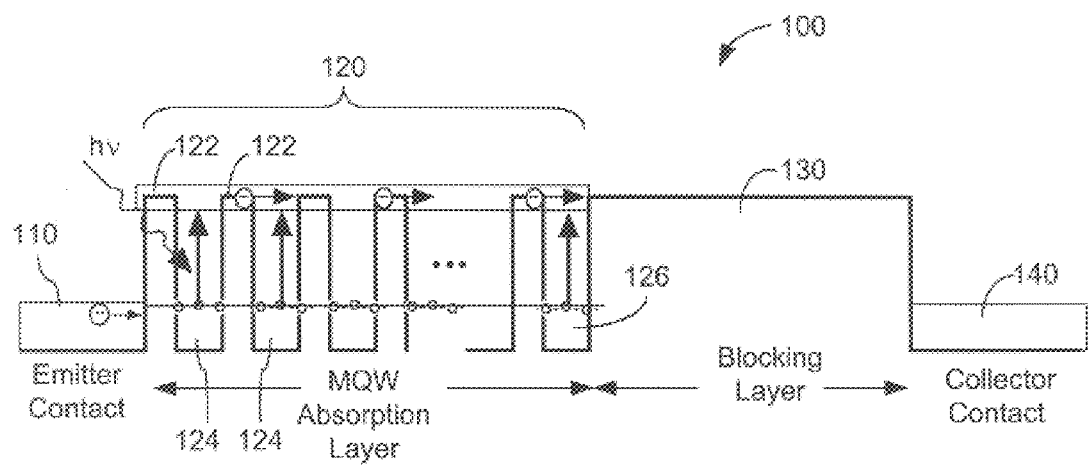
FIG. 1 shows a schematic diagram of the conduction band in a bound-to-quasibound quantum-well intersubband detector in an externally applied electric field.

FIG. 1 illustrates a portion of a BID device 100 according to one embodiment. The BID device 100 includes a MQW structure 120, an ohmic emitter contact layer 110 in contact with one side of the MQW structure 120, a blocking barrier layer 130 in contact with the opposite side of the MQW structure 120, and an ohmic collector contact layer 140 in contact with the blocking barrier layer 130. The entire BID device 100 is fabricated on a semiconductor substrate that is either on the side of the emitter contact layer 110 or on the side of the collector contact layer 140. The final BID device 100 may or may not include the substrate. In the latter case, the substrate is removed upon completion of fabricating the structures 110, 120, 130, and 140. The BID device 100 also includes a readout circuit that is coupled to the collector contact layer 140 to receive the output electrical signal caused by the optical absorption in the MQW structure 120. This readout circuit may be formed of a CMOS circuit that is electrically coupled to the BID device. In operation, an external voltage is applied between the emitter and the collector contact layers 110 and 140 to activate the MQW structure 120 to produce an electrical signal by absorbing light in resonance with an intersubband transition of the MQW structure 120 in the IR spectral range. A cryogenic chamber is also provided to enclose the device 100 under a desired cryogenic temperature that is generally above 20K.

The MQW structure 120 may be formed of a quantum-well supperlattice based on III–V semiconductors. In one embodiment, a GaAs-based GaAs/Al$_x$Ga$_{1-x}$As (0<x<1) MQW superlattice is used, where the GaAs forms the active quantum well layers and Al$_x$Ga$_{1-x}$As forms the barrier layers that sandwich each GaAs quantum well layer. Accordingly, the contact layers 110 and 140 are heavily doped conductive GaAs and the blocking layer 130 is a trap-fee Al$_x$Ga$_{1-x}$As that is grown under a high temperature condition. Both GaAs and Al$_x$Ga$_{1-x}$As are high bandgap materials to allow for relative easy fabrication in comparison with other low bandgap III–V materials such as Hg$_{1-x}$Cd$_x$Te and Pb$_{1-x}$Sn$_x$Te. Cameras utilizing QWIP focal-plane arrays as large as 640×486 format arrays have been demonstrated with corrected uniformity better than 99.95%. Due to use of artificially created band structure, spectral bandwidth of these detectors can be tailored from narrow ($\Delta\lambda/\lambda \sim 10\%$) to wide ($\Delta\lambda/\lambda \sim 50\%$) in the wavelength range between 4–20 $\mu$m allowing various applications. In addition, A simultaneously readable, dual band, 640×486 QWIP FPA may be used in the BID device 100 to provide innovative ways of simplify IR sensing instruments. In a two-color BID device, two different MQW structures that absorb light at two different IR wavelengths or spectral bands are integrated together. See, e.g., Gunapala et al., "8–9 and 14–15 $\mu$m Two-color 640×486 GaAs/AlGaAs Quantum Well Infrared Photodetector (QWIP) Focal Plane Array Camera," SPIE 3698, 687 (1999).

A MQW IR detector operates by photoexcitation of electrons between ground and first excited-state subbands of multi-quantum wells (MQWs) which are artificially fabricated by placing thin layers of two different, high-bandgap semiconductor materials alternately. In FIG. 1, the ground state subband is represented by line and the excited state suband is represented by an elongated box. Both subbands are minibands with their bandwidths and the bandwidth of the excited state miniband is greater than that of the ground state miniband. The bandgap discontinuity of two materials creates quantized subbands in the potential wells associated with conduction bands or valence bands. The structure parameters are designed so that the photo-excited carriers can escape from the potential wells and be collected as photocurrent.

Figure 2:
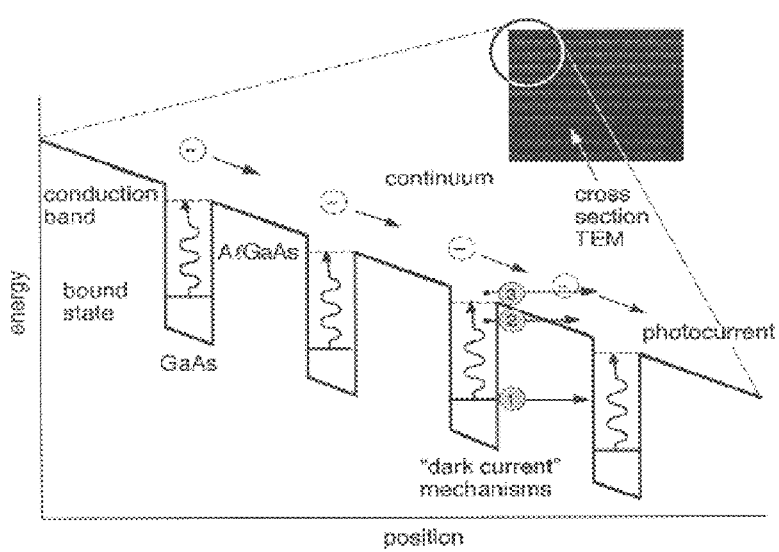
FIG. 2 shows one embodiment of a multi-quantum-well (MQW) detector structure in a blocked intersubband detector (BID) configuration, where the horizontal axis is the position along the growth direction of the semiconductor layers.

FIG. 2 illustrates the operation of the MQW structure 120 of the BID device 100 in FIG. 1, where the intersubband transition is a bound-to-quasibound transition within the conduction band in an externally applied electric field. Absorption of IR photons excites electrons from the ground state of the quantum well into the continuum to produce a photocurrent. The total output current, however, is a sum of the photocurrent and the dark current that is generated without the photo excitation. The dark current is the background noise and should be suppressed to improve the signal-to-noise ratio of the BID device 100, especially for applications where the received IR optical signals are weak.

As illustrated in FIG. 2, the MQW structure 120 has three main dark current mechanisms: (1) the ground state tunneling, (2) the thermally assisted tunneling, and (3) the thermionic emission. The contributions to the dark current from the two tunneling effects may be suppressed by using thick Al$_x$Ga$_{1-x}$As barrier layers to reduce the spatial overlap of the wavefunctions of adjacent GaAs quantum wells. The thick barrier layers also have a high resistivity experienced by the dark current which further reduces the magnitude of the dark current. The thermionic emission can be expressed as $I_t \propto e^{-\Delta E/kT}$, where $\Delta E$ is the effective barrier height measured from the ground state Fermi level, and T is the operating temperature. Hence, the thermionic emission decreases exponentially with decreasing operating temperature and can be suppressed by operating the device at a cryogenic temperature. Operation at the cryogenic temperature also suppresses the thermally assisted tunneling. Some semiconductor IR detectors are operated below 20K to achieve desired low dark currents.

It is recognized, however, that the above combination of using thick barrier layers and operating at low cryogenic temperatures suffer several technical difficulties. One difficulty, for example, is that the carrier population in the quantum well layers in the MQW structure is depleted by the photo excitation and there is no immediate refilling mechanism to replenish the carrier population in the quantum wells. This depletion reduces the responsivity $R(\lambda)$ of the device. This is because the responsivity is proportional to the absorption quantum efficiency $\eta_a(\lambda)$ which, in turn, is directly proportional to carrier doping density of the multi-quantum well structure. Although the thick barrier layers may not completely eliminate the ground state tunneling effect and hence some carrier population will eventually build up for optical absorption, the thick barrier layers slow down this residual replenishing process by reducing the probability of tunneling and by producing a high resistivity. Thus, the response time of the detector may be too slow for many applications where the incident IR radiation images change at high frequencies.

Another difficulty of the above combination is associated with operating at low cryogenic temperatures below 20 K. Indeed, the contributions to the dark current from the thermally assisted tunneling and the thermionic emission are significantly suppressed at such a low temperature. However, the operation of the CMOS readout circuit coupled to the detector may be adversely affected by the low operating temperature. Many CMOS circuits cannot operate properly below 20 K because the electrons in the CMOS circuits are "frozen" by being trapped to the impurity sites in Si.

The BID device 100, however, implements a different approach to achieving a low dark current. Instead of suppressing the dark current entirely within MQE structure 120, the BID device 100 distributes suppressing of the dark current partially within the MQW structure 120 and partially outside the MQW structure 120. The problem of population depletion in the quantum wells is addressed by the design of the MQW structure 120.

Notably, the MQW structure 120 uses a superlattice design with thin barrier layers formed by $Al_xGa_{1-x}As$ to spatially overlap the wavefunctoins of the quantum wells formed by GaAs. This structure facilitates the ground state and the thermally assisted tunneling effects and thus allows for carrier migration from the emitter contact layer 110 to the quantum wells to replace the photo-excited carriers. This tunneling-caused carrier migration, however, does not significantly contribute the total dark current of the BID device as described below. This design of the MQW structure is to replenish the carrier population in the quantum wells through the ground state tunneling. Hence, the carrier population in the quantum wells are sufficient for optical absorption even at low cryogenic temperatures that thermally assisted tunneling and the thermionic emission are suppressed for reducing the dark current within the MQW structure 120.

To reduce the thermal-related contributions to the dark current within the MQW structure 120, the BID device 100 is thermally isolated at a low temperature. However, instead of operating below 20 K, the BID device 100 is operated at a "compromised" higher cryogenic temperature that allows for proper operation of the CMOS readout circuit but is sufficiently low (e.g., below about 50K) to significantly suppress the thermionic emission that contributes to the total dark current. For example, the BID device may operate at 30 K. At such operating temperatures, the thermally assisted tunneling effect is also suppressed.

The BID device 100 further uses the blocking barrier layer 130 that is sufficiently thick to block any tunneling effect therethrough from the last layer of the MQW structure 120: a quantum well 126 in direct contact with the blocking barrier layer 130. Alternatively, the last layer of the MQW structure 120 may be a thin barrier layer 122. Hence, although the MQW structure 120 allows for the ground state tunneling and the thermally assisted tunneling so that the carriers can migrate from the emitter contact layer 110 towards to collector contact layer 140 within the MQW structure 120, the thick blocking barrier layer 130 essentially blocks such carriers from migrating to the collector contact layer 140. Hence, such carrier migration does not significantly contribute to the dark current. In essence, the carriers migrated by tunneling through the thin barrier layers 122 can only reach the collector contact layer 140 through excitation to the quasibound state on the top of the quantum well by optical absorption and through the photocurrent under action of the external applied electric field applied to the contact layers 110 and 140.

Using the above BID device design, the MQW structure 120 may be engineered to meet various specific application requirements. For example, a long-wavelength large format QWIP focal plane array can be used in a ground based astronomy experiment. The wavelength of the peak response and cutoff can be continuously tailored over a range wide enough to enable light detection at any wavelength range between 6–20 μm. Also, QWIP device parameters can be optimized to achieve high performances at lower operating temperatures (~30 K) due to exponential suppression of dark current. Furthermore, QWIPs offer low cost per pixel and highly uniform large format focal plane arrays (FPAs) mainly due to mature GaAs/AlGaAs growth and processing technologies. The other advantages of GaAs/AlGaAs based QWIPs are higher yield, lower 1/f noise and radiation hardness. For example, the QWIP focal plane arrays allows a camera to operate by modulating the optical signal with a nod period up to 100 s. A 500 s observation on dark sky using such a camera renders a flat image with little indication of the low spatial frequency structures associated with imperfect sky subtraction or detector drifts. The following sections describe some specific aspects of QWIPs.

Spectral coverage of conventional interband infrared (IR) detectors is determined by the bandgap because photoexcitation occurs across the band gap ($E_g$) from the valence to conduction band. Therefore, detection of mid wavelength (8–15 μm) IR radiation requires small bandgap materials such as $Hg_{1-x}Cd_xTe$ and $Pb_{1-x}Sn_xTe$, in which the energy gap can be controlled by varying x. Such low band gap materials are known to be more difficult to grow and process than large band gap semiconductors such as GaAs. Thus, it is difficult to produce them in large format uniform arrays. Quantum Well Infrared Photodetectors (QWIPs) avoid such difficulties because they are fabricated using high bandgap materials systems such as $GaAs/Al_xGa_{1-x}As$.

The absolute responsivity $R(\lambda)$ of a QWIP can be written in terms of absorption quantum efficiency ($\eta_a(\lambda)$) and photoconductive gain (g) as, $R(\lambda)=(e/h\nu)\eta_a(\lambda)g$. Typical absorption quantum efficiency of a QWIPs $\eta_a(\lambda)$—is about 10%–30%, and directly proportional to carrier doping density of the multi-quantum well structure. Photoconductive gain of a QWIP detector is determined by the position of the excited state relative to the barrier and the number of quantum wells in the structure. For a typical 50 quantum wall bound-to-quasibound QWIP, photoconductive gain g varies from −10% to −50% with the operating bias voltage. The net quantum efficiency (i.e., the product of the quantum efficiency and gain) of a QWIP is reduced due to less than 100% gain resulting a lower photocurrent. However, resulting signal to noise ratio is not reduced by the same factor because both dark current and noise of the detector will be reduced due to the same reason. Also, it is important to note that, background-limited sensitivity is independent of photoconductive gain g.

Spectral responsivity peak wavelength ($\lambda_p$) of a QWIP is determined by the energy difference between ground and excited states of the quantum well. Unlike the responsivity spectra of intrinsic infrared detectors, QWIPs spectra are much narrower and sharper due to their resonance intersubband absorption. Typically, responsivity spectra of the bound and quasibound excited state QWIPs are much narrower ($\Delta\lambda/\lambda \sim 10\%$) than the continuum QWIPs ($\Delta\lambda/\lambda = 24\%$). This is due to the fact that, when the excited state is placed in the continuum band above the barrier, the energy width associated with the state becomes wide. Spectral band width of these QWIPs can be further increased by replacing single quantum wells with small superlattice structures (several quantum wells separated by thin barriers) in the multi-quantum well structure. Such a scheme creates an excited state miniband due to overlap of the excited state wavefunctions of quantum wells. Energy band calculations based on a two band model shows excited state energy levels spreading greater than 30 meV.

Figure 3:
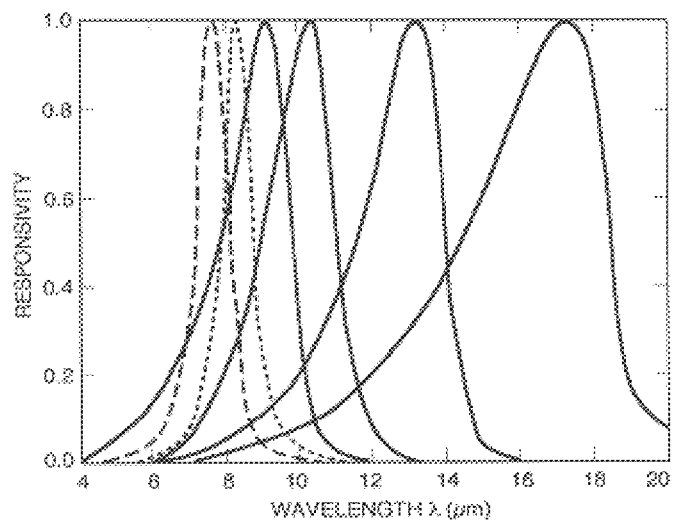
FIGS. 3, 4, and 5 show spectral properties of MQW IR detectors.
Figure 4:
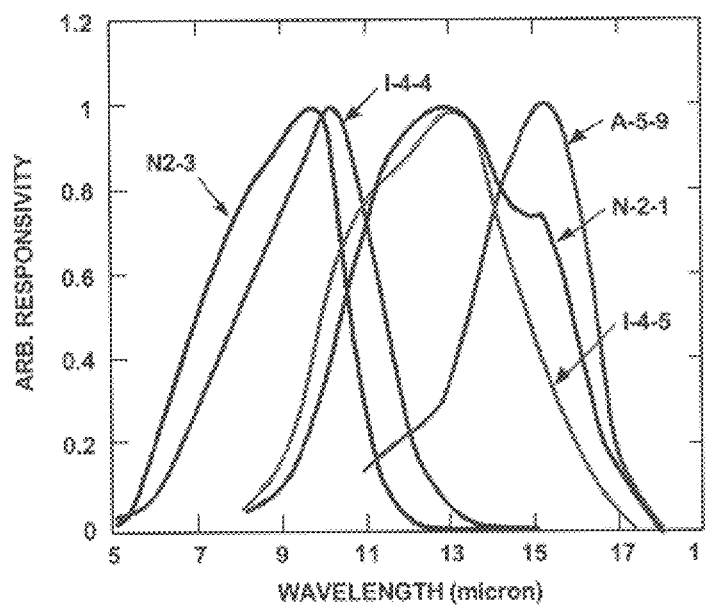
Figure 5:
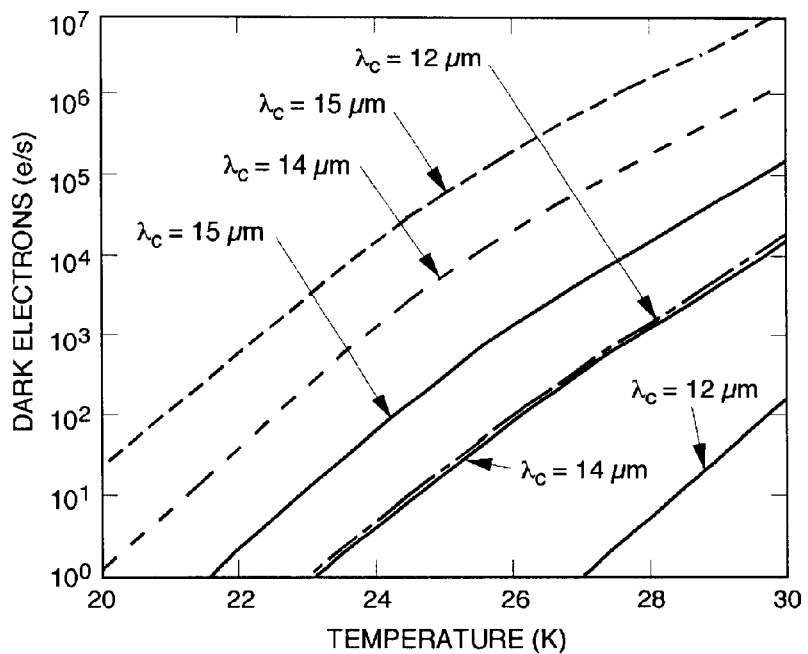

FIG. 3 shows the spectral coverage and tailorability of QWIPs in 4–20 $\mu$m wavelength range. The lattice matched GaAs/AlxGa1-xAs material system is commonly used to create a. QWIP structures similar to the structure shown in FIG. 2. Highly uniform and pure crystal layers of such semiconductors can be grown on large substrate wafers, with control of each layer thickness down to a fraction of a molecular layer, using modern crystal-growth methods like molecular beam epitaxy (MBE). Thus, by controlling the quantum well width and the barrier height (which depends on the Al molar ratio of AlxGa1-xAs alloy), this intersubband transition energy can be varied over a wide enough range to enable light detection at any wavelength range between 4–20 $\mu$m. FIG. 4 shows experimentally measured responsivity spectra with 50% bandwidth $\Delta\lambda > 5$ $\mu$m. FIG. 5 shows estimated low temperature (T=20–30 K) dark current per 40×40 $\mu$m$^2$ pixel as a function of the cut-off wavelength of graded barrier bound-to-quasi-bound QWIPs. The detectors represented by solid lines are doped to a density of ND=8×1017 cm$^{-3}$ and expected achieve 25% peak absorption quantum efficiency. The detectors represented by dashed lines are doped to a density of ND=1.4×1018 cm$^{-3}$ and expected achieve higher peak quantum efficiency and broader responsivity. Thus, control of the processing allows for tailoring the QWIP characteristics to the specific application.

The absorption quantum efficiency may be improved by adding more carriers into the quantum wells. However, carrier density cannot be increased without limit because it can lead to a higher dark current, which degrades the performance of the detector. The dominant noise in many QWIP devices is due to the shot noise resulting from the dark current in the device. Therefore, it is desirable to find the optimum $N_D$ within the given constrains of the application. As shown in FIG. 2, the dark current originates from three main processes; well to well quantum mechanical tunneling, thermally assisted tunneling, and classical thermionic emission. Consequently, for QWIPs operating at higher temperatures, the last mechanism is the major source of dark current. If a detector operates at a lower temperature, the photosignal of the detector can be improved by adding more carriers to the multi-quantum well structure, regardless of any increase in dark current. Further reduction in low temperature dark current can be achieved by introducing slightly upward graded barriers to multi quantum well structure. This can be achieved easily during the MBE growth of the wafers by slightly increasing the Al concentrations while growing the barriers. These upward graded barriers experience a lower effective electric field than the typical rectangular barriers under an applied bias voltage. This leads to a smaller effective barrier lowering for graded barrier structures, yielding a lower dark current. FIG. 5 shows the predicted dark current in terms of generated dark electrons as a function of the cutoff wavelength and temperature for both graded and typical QWIP structures. Note that for the graded QWIP the predicted dark current is less than 10 e/s at all wavelengths shortward of 15 $\mu$m for T-25K. Such improvements would enable such applications as the Outer Solar System Explorer and enhance the usefulness of QWIPs for spectroscopic applications.

Two exemplary QWIP focal plane arrays have been designed for ground-based mid-infrared camera QWICPIC (QWIP Wide-field Imaging multi-Color Prime-focus Infrared Camera) operated at the prime focus of the 5-m Hale telescope at Mt. Palomar. QWICPIC is specifically designed to take advantage of the large format, narrow band, low 1/f noise, and excellent linearity and noise performance of QWIP arrays under high background conditions. This prime focus camera is designed to image a large 2'×2' field simultaneously onto three large format focal plane arrays. QWICPIC currently houses dichroic optics enabling observations with 3 focal plane arrays simultaneously at 4.7, 8.5, and 12.5 $\mu$m. The optics was designed to simultaneously optimized the image quality at the focal plane and the image quality of the pupil stop on the primary mirror. The FPAs are thermally isolated to operate at ~30 K.

The QWIP FPA device structures have 30 quantum well periods, each period containing a GaAs well and a $Al_xGa_{1-x}As$ barrier, sandwiched between top and bottom contact layers doped n=5×10$^{17}$ cm$^{-3}$, grown on a semi-insulating GaAs substrate. The cap layer on top of a stop-etch layer was grown in situ on top of the device structure to fabricate the light coupling 2-D grating structure. The GaAs quantum well thickness and Al concentration (x) of $Al_xGa_{1-x}As$ barriers of the two devices were optimized to respond in 8–9 and 12–13 $\mu$m spectral bands while operating in bound-to-continuum mode.

Figure 6A:
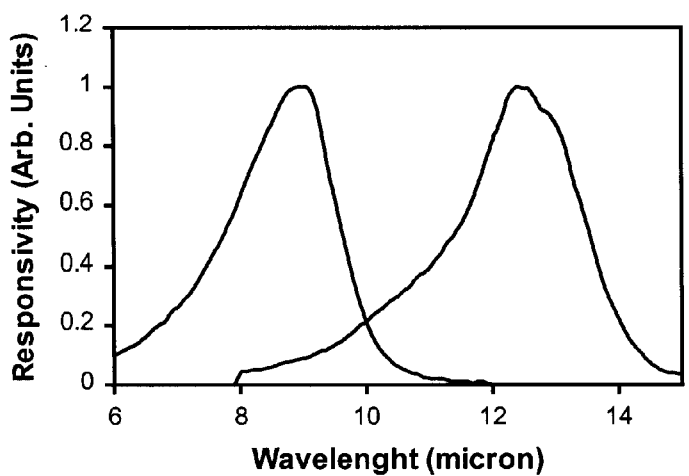
FIGS. 6A, 6B, and 7 show measured responses of two MQW IR detectors.
Figure 6B:
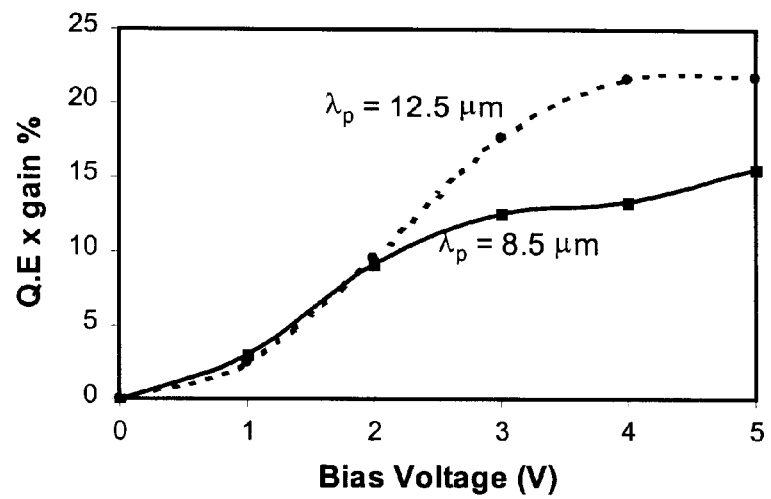
Figure 7:
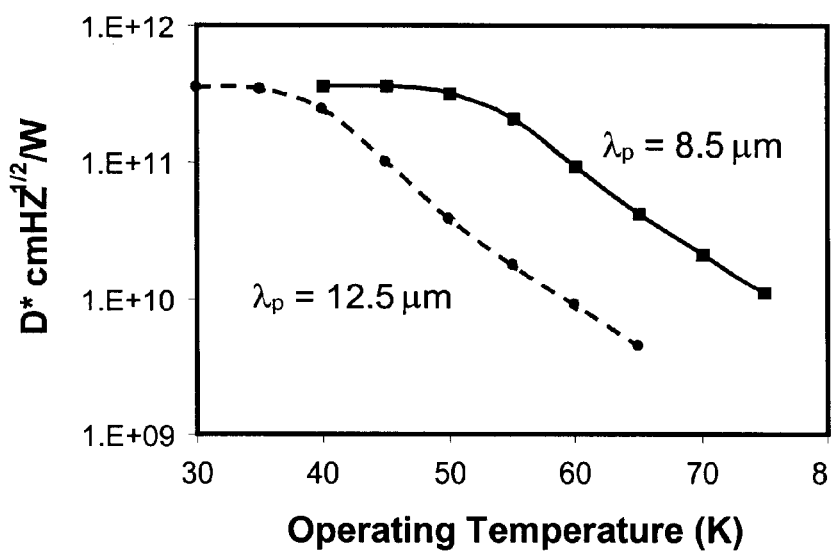

FIGS. 6A and 6B show the measured responsivity spectrum and the measured responsivity as a function of the bias voltage of each detector, respectively. Due to lower operating temperatures, dark currents were suppressed and both devices operate above background limited conditions. These responsivities show about six fold enhancement over previously demonstrated FPAs which were designed for higher operating temperatures. FIG. 7 shows the peak detectivity D* vs operating temperatures for a background equivalent to QWICPIC operating at the prime focus of the Mt. Palomar 5-m Hale Telescope. The photon flux is 20% of 300 K, f/3.3 background.

The first science grade 256×256 focal plane array was developed using the 8–9 $\mu$m QWIP and implemented in the QWICPIC camera. The excellent photometric and noise characteristics of the 256×256 QWIP focal plane array allow QWICPIC to observe at the prime focus of the 5-m Hale telescope.

Figure 8:
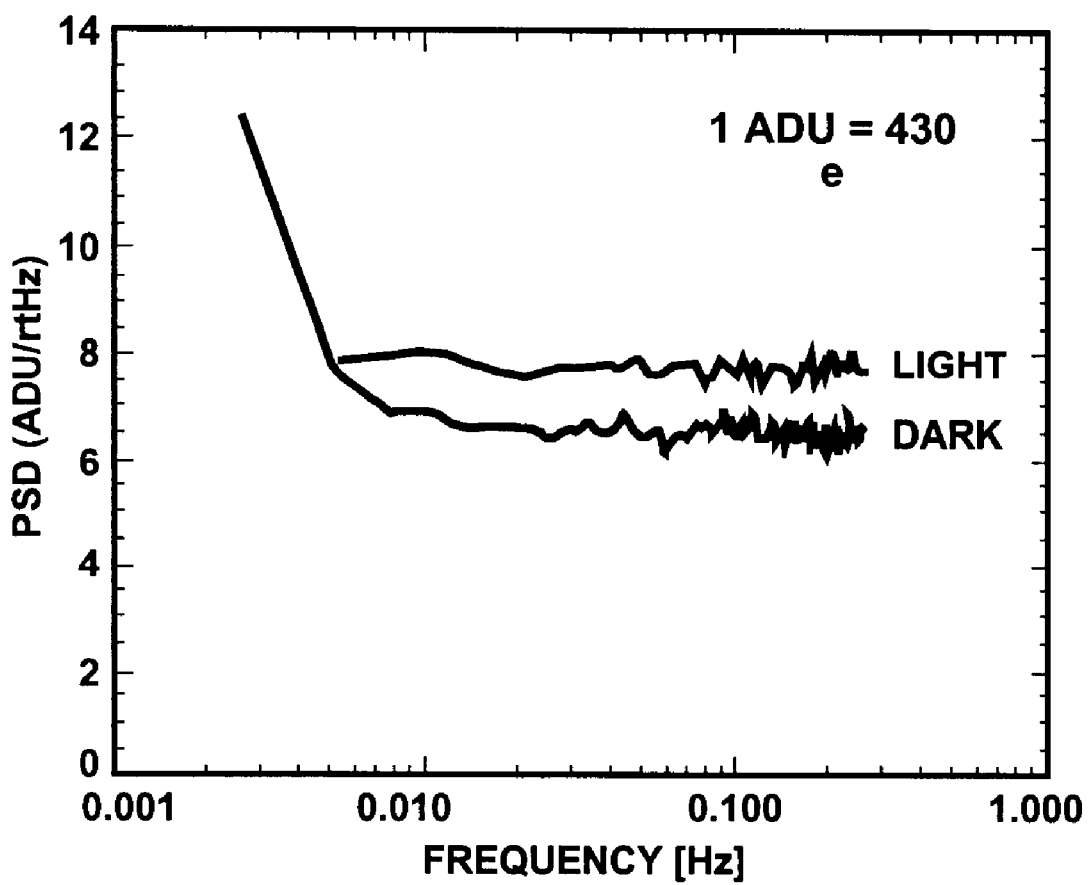
FIG. 8 shows measured noise spectral density of a MQW IR detector array.

FIG. 8 shows the noise spectral density of a 8–9 um 256×256 QWIP focal plane array (1 ADU=430 e⁻). The lack of 1/f noise above 10 mHz allows for slow modulation and scanning strategies commonly required in space-borne applications. QWICPIC exploits this advantage in operating at the prime focus by modulating the optical signal with a slow nod period of 20–100 seconds. The images of some stars were obtained with minimal data processing: coaddition of frames, sky subtraction, removal of hot pixels, and smoothing in the case of NGC 1068. Faint structures, $10^4$ times fainter than the brightest source, are apparent with no noticeable bleeding of bright sources or other non-photometric effects. The faint ring around NGC 1068 was imaged in 2400 s at a sensitivity of 3 mJy in a 1" beam. The remarkable noise stability—and low 1/f noise—of (QWIP focal plane arrays enable QWICPIC to operate by modulating the optical signal with a nod period up to 100 s. A 500-second observation on dark sky renders a flat image with little indication of the low spatial frequency structures associated with imperfect sky subtraction or detector drifts. To our knowledge, QWICPIC represents both the first 256×256 mid-infrared imager and the first successful example of a ground-based instrument using slow-nod modulation at mid-infrared wavelengths. The QWICPIC was operated at the Palomar telescope without the high frequency background subtraction usually implemented for thermal infrared astronomy via a chopping secondary mirror. Instead, the subtraction was carried out at low frequency by nodding the telescope once per 30 seconds over an angle of ~5 arcmin. The resulting high quality image reflects the excellent low frequency noise performance of this device (FIG. 8). This could be a valuable attribute in an Explorer-class mission or NGST for which fiscal constraints might mitigate against either a chopping/scanning mirror or a particularly agile attitude control system. To our knowledge, QWICPIC represents both the first 256×256 mid-infrared imager and the first successful example of a ground-based instrument using slow-nod modulation at mid-infrared wavelengths.

QWIP is a high impedance photoconductive device and thus, as described above, needs a sufficient dark or background photo current to replenish the depleted quantum wells. This is not an issue for QWIP detectors which operate at high background conditions. However, the performance of QWIP at low irradiance environments (i.e., extremely low photo current) and at low temperature operation (i.e., low dark current) degrades due to the delay in depleted well replenishment. Therefore, if QWIP operates under these stringent low irradiance and low temperature conditions, its responsivity depend on frequency and the shape of the frequency response depends on the operational conditions. The non-flat frequency response curves of QWIPs at low background and low operating temperature conditions are empirically similar to dielectric relaxation effects observed in bulk extrinsic silicon and germanium photoconductors under similar operational conditions.

In principle, QWIP operates similarly to extrinsic bulk photoconductors in some aspects. Electrons in the subbands of the isolated quantum wells can be visualized as electrons attached to impurity states in bulk photoconductors. As photo-generated electron leaves the active doped quantum well region, it leaves behind a space-charge buildup which impedes another electron from entering the detector from the opposite electrode. For low-background irradiance levels, high resistivity of the active region due to thick barriers could leads to a delay in refilling space-charge buildup. This results in a lower responsivity at high optical modulation frequencies, similar to dielectric relaxation in bulk photoconductors. In order to overcome this problem, the MQW structure shown in FIG. 1 is designed to separate the active quantum well region from blocking barriers. MQW structure quantum wells are separated by thin barriers creating a miniband due to large overlap of sublevel wave functions. Thus, space-charge buildup will get quickly refilled by electrons via sequential resonant tunneling from the contact layer closer to the emitter contact layer 110. In order to suppress the dark current, the thick impurity free blocking barrier 130 is placed between the active region 120 and collector contact 140.

In radiation detectors, the cutoff wavelength determines the unwanted dark current and thus the signal-to-noise ratio and operating temperature of the device. In comparison, Si IR detectors have cutoff wavelengths that depend on the cutoff wavelengths of naturally available impurity ions such as As, Ga, P. etc. For silicon, these wavelengths are in 25–40 microns spectral region. Therefore, silicon IR detectors need be cooled to 8–10 K cryogenic temperature for operation, though one would like to use those detectors for rather short wavelengths (e.g., 10 or 15 microns). One of many advantages of the MQW based BID detector is that its infrared sensing photo emitter is a GaAs/AlGaAs based superlattice, thus, its cutoff wavelength can be easily tuned by band gap engineering of GaAs/AlGaAs based MQWs (i.e., tailorable cutoff wavelengths). Therefore, if a shorter wavelength operation such as 10 or 15 microns cutoff is desirable, the MQW based BID detectors can operate at much higher cryogenic temperatures such as 30 Kelvin at low background conditions. This new device structure avoids dielectric relaxation effect. The depleted quantum wells get replenished by the superlattice miniband conduction.

Only a few embodiments are disclosed. However, it is understood that variations and enhancements may be made without departing from the spirit of and are intended to be encompassed by the following claims.

What is claimed is:

1. A device, comprising a radiation detector which includes:

an emitter contact layer;

a multi-quantum-well structure having a first side in contact with said emitter contact layer and an opposing second side, said multi-quantum-well structure formed of alternating quantum well layers and barrier layers, each barrier layer being of a thickness that allows for a spatial overlap of wavefunctions of adjacent quantum wells to form a common miniband within the quantum wells and to permit a tunneling therethrough from one quantum well to an adjacent quantum well;

a blocking barrier layer in contact with said second side of said multi-quantum-well structure and having a thickness that substantially prohibits a tunneling therethrough;

a collector contact layer in contact with said blocking barrier layer;

a cryogenic chamber that encloses said radiation detector and maintains a chamber temperature between 20 K and 50 K during operation of said radiation detector; and a CMOS readout circuit coupled to said collector contact layer to receive a signal caused by radiation absorbed by said multi-quantum-well structure.

2. The device as in claim 1, wherein each quantum well layer includes GaAs, and each of said barrier layers and said blocking barrier layer includes $Al_xGa_{1-x}As$ (0<x<1).

3. The device as in claim 2, wherein said emitter and said collector contact layers are formed of GaAs doped to be conductive.

4. The device as in claim 1, wherein said multi-quantum-well structure has a structure to support said common miniband within said quantum wells as a bound state and a quasibound state within a conduction band.

5. The device as in claim 1, wherein said multi-quantum-well structure has a structure to support said common miniband withinin said quantum wells as a bound state and a quasibound state within a valence band.

6. A method, comprising:

providing a multi-quantum-well structure to allow for carrier tunneling through a barrier layer from one quantum well to an adjacent quantum well to provide carriers for optical absorption, wherein the multi-quantum-well structure includes quantum wells separated by thick barrier layers to spatially overlap wavefunctions of the quantum wells to form a first common miniband within the quantum wells and a second common miniband as a quasibound state at a top of the quantum wells; and preventing any carrier tunneling from the multi-quantum-well structure to a contact layer that receives carriers from the multi-quantum-well structure to reduce a dark current.

7. The method as in claim 6, further comprising:

coupling a CMOS circuit to the multi-quantum-well structure to read an output; and maintaining a temperature of the multi-quantum-well structure and the CMOS circuit at a cryogenic temperature between 20 K and 50 K to suppress a thermal contribution to the dark current while maintaining the CMOS circuit operable.

8. A device, comprising:

a first contact layer formed of a conductive material;

a multi-quantum-well structure having a first side in contact with said first contact layer and an opposing second side, said multi-quantum-well structure formed of alternating quantum well and barrier layers, each barrier layer being sufficiently thin to spatially overlap wavefunctions of quantum wells to form a first common miniband within said quantum wells, said multi-quantum-well structure configured to have a second common quasibound miniband at a top of said quantum wells to allow for an intraband transition between said first common miniband and said second common qusibound miniband;

a blocking barrier layer in contact with said second side of said multi-quantum-well structure and having a thickness that substantially prohibits a tunneling therethrough; and a second contact layer formed of a conductive material and in contact with said blocking barrier layer, wherein said first and said second contact layer are electrically coupled to supply a driving voltage to said multi-quantum-well structure.

9. The device as in claim 8, further comprising:

a cryogenic chamber that encloses said multi-quantum-well structure under a chamber temperature between 20 K and 50 K during operation; and a CMOS readout circuit located in said cryogenic chamber and electrically coupled to receive a signal caused by radiation absorbed by said multi-quantum-well structure.

10. The device as in claim 8, wherein each quantum well layer includes GaAs, and each of said barrier layers includes $Al_xGa_{1-x}As$ ($0<x<1$).

11. The device as in claim 8, wherein multi-quantum-well structure includes quantum wells formed of at least two different material compositions to absorb light at two intraband transitions of different radiation wavelengths.

* * * * *